(12) United States Patent
Nagode et al.

(10) Patent No.: US 6,760,208 B1
(45) Date of Patent: Jul. 6, 2004

(54) DISTRIBUTIVE CAPACITOR FOR HIGH DENSITY APPLICATIONS

(75) Inventors: Thomas D. Nagode, Vernon Hills, IL (US); Gregory Redmond Black, Vernon Hills, IL (US)

(73) Assignee: Motorola, Inc., Schaumburg, IL (US)

( * ) Notice: Subject to any disclaimer, the term of this patent is extended or adjusted under 35 U.S.C. 154(b) by 23 days.

(21) Appl. No.: 10/331,901

(22) Filed: Dec. 30, 2002

(51) Int. Cl.$^7$ ................................................. H02H 7/00
(52) U.S. Cl. ........................ 361/107; 361/761; 361/766; 333/184
(58) Field of Search ................................. 361/100, 761, 361/763, 762, 766, 107; 333/184–186

(56) References Cited

U.S. PATENT DOCUMENTS 6,103,134 A * 8/2000 Dunn et al. ................... 216/17
6,185,354 B1 * 2/2001 Kronz et al. ................ 385/129
6,606,793 B1 * 8/2003 Dunn ............................ 29/853

* cited by examiner

Primary Examiner—Anthony Dinkins
(74) Attorney, Agent, or Firm—Posz & Bethards, PLC; Charles W. Bethards

(57) ABSTRACT

A distributive capacitor 205 and impedance matching network 201 and transmitter 101 that use the capacitor and are suitable for high density integration applications include a printed circuit substrate 303 comprising one of a printed circuit board and a silicon based substrate, a first conductive layer 305 disposed on the printed circuit substrate, a layer of dielectric material 307 disposed on the first conductive layer and having a thickness, the dielectric material having a dielectric constant more than five times greater than the dielectric constant of the printed circuit substrate; and a second conductive layer 309 disposed on the layer of dielectric material and having a second length 311 and a second width 603 that are selected so that the distributive capacitor operates as a transmission line.

25 Claims, 4 Drawing Sheets

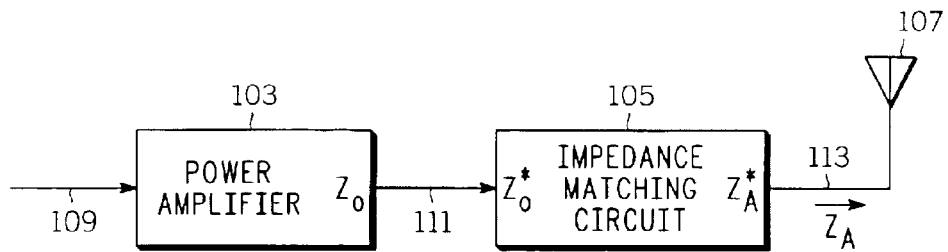
FIG. 1
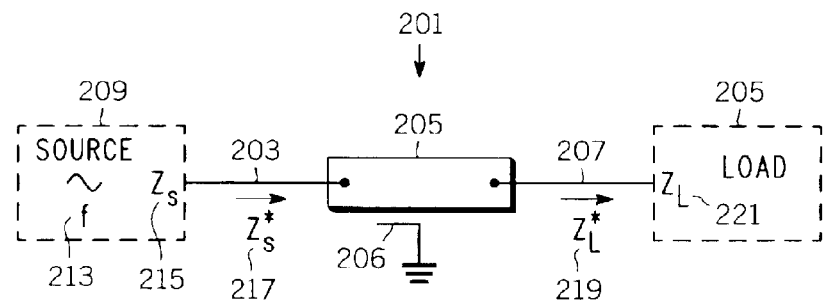
FIG. 2
FIG. 3
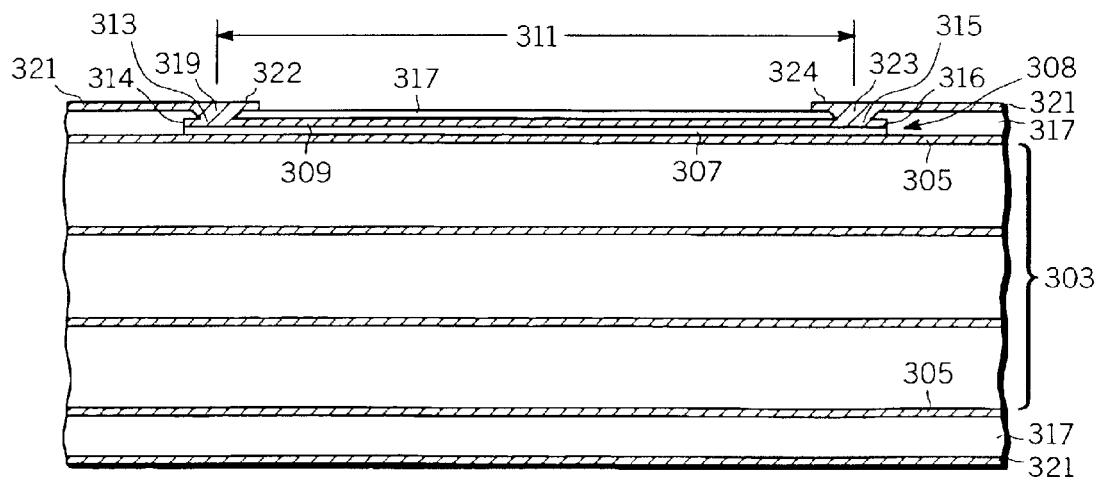

US 6,760,208 B1

DISTRIBUTIVE CAPACITOR FOR HIGH DENSITY APPLICATIONS

FIELD OF THE INVENTION

This invention relates in general to high density applications, and more specifically to a distributive capacitor for facilitating impedance matching in various circuits, such as transmitters and other radio frequency circuitry.

BACKGROUND OF THE INVENTION

There are various ways of doing impedance matches and these have different performance characteristics, physical space requirements and associated costs or economic considerations. For example, lumped components, such as capacitors and inductors may be used however they tend to produce a reasonable impedance match over a very limited bandwidth or frequency range, require assembly, and physical space, and may be a problem in cost sensitive applications, such as cellular phones. Distributive networks using strip lines and micro strip lines may be used to solve the bandwidth concerns. If these distributive networks are built on conventional substrates, such as FR-4 printed circuit boards, normal assembly costs are reduced or eliminated, however they require large physical areas relative to the area available at the frequencies of interest in space sensitive applications, such as portable devices like cellular handsets and the like. Separate distributive elements could be used but costs and space may still be a problem. Clearly a need exists for distributive capacitors that are space and cost efficient and demonstrate appropriate performance characteristics.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 1 depicts, an exemplar block diagram of a transmitter having an impedance matching arrangement using a distributive network;

FIG. 2 depicts a generalized impedance matching circuit using a distributive capacitor for coupling a source to a load;

FIG. 3 depicts a side elevation view of a distributive capacitor showing the structure thereof;

DETAILED DESCRIPTION OF PREFERRED EMBODIMENTS

Figure 4:
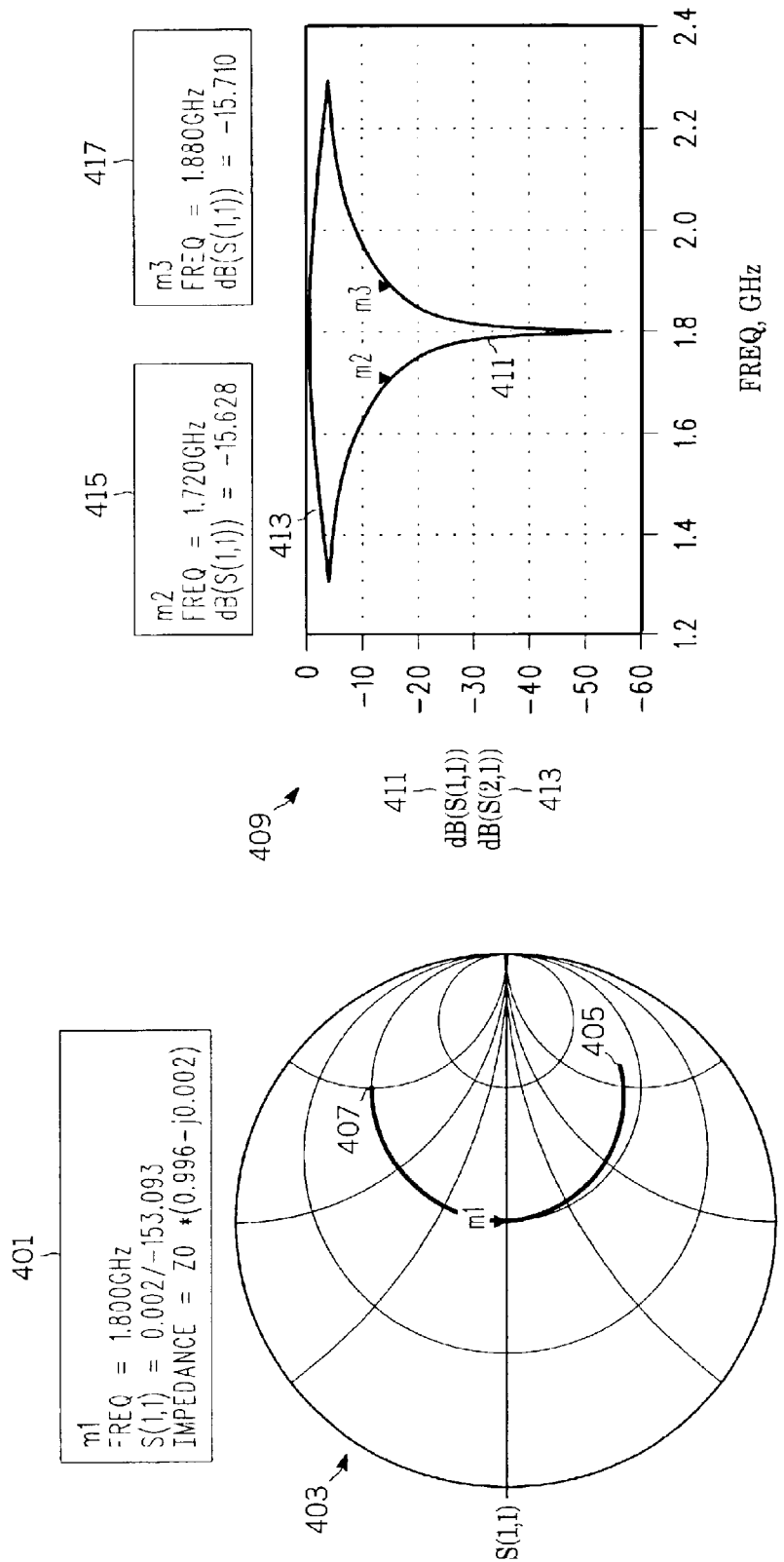
FIG. 4 and FIG. 5 illustrate simulation results for various embodiments of the distributive capacitor of FIG. 3.

In overview, the present disclosure concerns high density applications and more particularly a distributive capacitor and applications thereof that are suitable for high density matching networks for use where a premium is placed on one or all of flexibility, performance, cost and space. Such applications are found in portable devices such as present and future generation cellular phones or subscriber devices operating at 840 MHz and above with special emphasis on 1.6 GHz and above.

As further discussed below various inventive principles and combinations thereof are advantageously employed to construct and provide a distributive capacitor suitable for disposing on printed circuit substrates, including printed circuit boards or semiconductor based substrates, such as silicon, Gallium-Arsinide, Gallium Nitride, other compound semiconductors, or the materials on which semiconductors arc grown or attached such as silicon dioxide or sapphire. The distributive capacitor has distinctive and surprising flexibility, size and cost advantages and appropriate performance levels for bandwidth, return loss and the like provided these principles or equivalents thereof are utilized.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions.

Much of the inventive functionality and many of the inventive principles are best implemented with or in more or less conventional printed circuit board processing technologies or semiconductor processes. It is expected that one of ordinary skill, notwithstanding possibly significant effort and many design choices motivated by, for example, available time, current technology, and economic considerations, when guided by the concepts and principles disclosed herein will be readily capable of generating and utilizing such printed circuit board processing technologies or semiconductor or silicon processes with minimal experimentation. Therefore, in the interest of brevity and minimization of any risk of obscuring the principles and concepts according to the present invention, further discussion of such processing or processes, if any, will be limited to the essentials with respect to the principles and concepts used by the preferred embodiments.

Referring to FIG. 1 an exemplary block diagram of a transmitter having an impedance matching arrangement using a distributive network will be discussed and described. FIG. 1 shows a radio frequency power amplifier 101 for amplifying a signal available at terminal 109 and driving an antenna network 107 having predetermined impedance $Z_A$. The power amplifiers of particular interest are those suitable for use in cellular devices or handsets however the concepts and principles discussed and described are useful for other applications with low to modest power output levels on the order of one to ten watts. The frequency range of interest is 840 MHz and above with special consideration given to 1.6 GHz to 2.4 GHz with much of the specific discussions herein focusing on 1.8 GHz or the GSM (Global System for Mobile communications) frequency band.

The power amplifier comprises a power amplifier stage 103 or module having a complex (magnitude and angle) output impedance $Z_O$ that provides an amplified signal at terminal 211. The power amplifier is available in suitable form from various manufacturers such as Motorola or RF Micro Devices. Further the power amplifier comprises an impedance matching circuit 105 disposed on a printed circuit substrate comprising, for example, either a printed circuit board or a silicon or semiconductor based substrate. The impedance matching circuit 105 is coupled to the amplified signal at 211 and provides an input impedance that is a complex conjugate (Z* denotes complex conjugate of Z) of the complex output impedance $Z_O$ of the power amplifier stage for the amplified signal. In practice the input impedance may have a magnitude on the order of one ohm and an output impedance on the order of a 50 ohm antenna, although the antenna impedance may be substantially different in many applications.

The impedance matching circuit, as will be discussed in more detail below with reference to FIG. 3, further comprises a distributive capacitor arranged and constructed to act as a transmission line that includes a first conductive layer disposed on the printed circuit substrate, a layer of dielectric material disposed on the first conductive layer and having a thickness, where the dielectric material has a dielectric constant more than five times greater than the dielectric constant of the printed circuit substrate; and a second conductive layer disposed on the layer of dielectric material. The second conductive layer has a second length selected to exceed ten percent of a wavelength for the amplified signal and a second width that are selected so that the impedance matching circuit operates as a transmission line at the frequency of interest. The second conductive layer includes a first end that is coupled to the amplified signal and a second end separated by the second length from the first end, where the second end is coupled to the antenna network 107 at a terminal 113 and provides an output impedance that is a complex conjugate of a predetermined impedance $Z_A$ of the antenna network.

Note that the output of most power amplifier stages should go through a harmonic filter that is not specifically shown. The harmonic filter may be part of the impedance matching circuit or part of the antenna network 107. Note also that a connection is usually made from the antenna to a receiver via an RF switch or diplexor, and that such a connection may be a part of the antenna network. Note also that the input to the power amplifier stage at terminal 109 with the input signal to be amplified will normally also come from another amplifier stage that is not shown and these stages will ordinarily require an impedance matching circuit. This may be another impedance matching circuit similar to the circuit 105 with of course different input and output impedances. The general situation is shown in FIG. 2.

Referring to FIG. 2, a generalized impedance matching circuit 201 using a distributive capacitor 205 for coupling a source 209 to a load 211 will be discussed and described. FIG. 2 shows an impedance matching circuit 201 suitable for high density integration applications and operable for matching a source impedance to a load impedance. The matching circuit comprises an input terminal 203 that provides an input impedance 217 that is a complex conjugate of a predetermined source impedance, $Z_S$ 215 for a signal 213 having a predetermined frequency f. Further included is the distributive capacitor 205 disposed on a printed circuit substrate comprising either a printed circuit board or a semiconductor based substrate.

FIG. 2 has heretofore been used to describe a single-ended matching circuit. FIG. 2 may also describe a differential matching circuit by the half-circuit representation technique. In the differential half-circuit case the signals at 203 and 207 represent differential mode signals, which are physically embodied by two common mode signals having equal amplitude and opposite phase. In the differential half-circuit case the ground connection 206 represents a virtual ground, having no physical embodiment.

As will be discussed further below, the distributive capacitor further comprises a first conductive layer disposed on the printed circuit substrate, a layer of dielectric material disposed on the first conductive layer and having a thickness, the dielectric material having a dielectric constant more than five times greater than the dielectric constant of the printed circuit substrate; and a second conductive layer disposed on the layer of dielectric material and having a second length selected to exceed ten percent of a wavelength for the signal having the predetermined frequency and a second width that are selected so that the distributive capacitor operates as a transmission line. The second conductive layer includes a first end that is coupled to the input terminal 203 and a second end separated by the second length; and an output terminal 207, coupled to the second end, that provides an output impedance that is a complex conjugate of a predetermined load impedance, $Z_L$, 221 for the signal having the predetermined frequency. This general purpose impedance matching circuit will have broad applications in many radio frequency applications including for example receiver front ends or amplifiers and matches into mixers and the like.

Referring to FIG. 3 a side elevation view of the distributive capacitor 205 from FIG. 2 showing the structure thereof will be discussed and described. FIG. 3 depicts the distributive capacitor 205 that is suitable for high density integration applications where many lumped components may be embedded below the surface level of the substrate. This has many advantages, such as little or no surface area is used, no assembly time is required, and low material cost. The distributive capacitor 205 comprises a printed circuit substrate 303 such as either a printed circuit board or a semiconductor based substrate with a printed circuit board depicted. The printed circuit board comprises a multi-layer FR-4 glass epoxy based structure with layers of glass epoxy sandwiching layers of copper foil that is known and widely used by those of ordinary skill.

The distributive capacitor 205 further comprises a first conductive layer 305 disposed on the printed circuit substrate. This conductive layer 305 is laminated and patterned according to standard printed circuit board techniques and will be included on both sides of the substrate. It is possible to fabricate additional passive components in or on either of the conductive layers 305 using for example polymer thick film materials for resistors and so on. Further included is a layer of dielectric material 307 disposed on the conductive layer 305 and having a length, a width (not shown in this diagram), and a thickness 308. The typical thickness is approximately 2/1000 of an inch or 2 mils. The dielectric material is selected to have a dielectric constant more than five times greater than the dielectric constant of the printed circuit substrate. For example, for FR 4 printed circuit board substrate the relative dielectric constant is approximately 4.3 and the dielectric materials are available with relative dielectric constants, of 20 to 100 or more.

The distributive capacitive may also be constructed with use of a high dielectric layer inserted into a multi-layer substrate or disposed over the first conductive layer, i.e. the length and width are such as to cover essentially all of the printed circuit substrate. Examples of multi-layer substrates are FR4 printed circuit board and low temperature co-fire ceramic (LTCC) multi-layer ceramic.

The distributive capacitor 205 further comprises a second conductive layer 309 that comprises preferably a copper or copper based material or other conductive material on the order of 1/1000 of an inch in thickness that is disposed on the layer of dielectric material 307 and that has a second length 311 and a second width (not shown) that are selected so that the distributive capacitor operates as a transmission line. Preferably, the second length is selected to exceed ten percent of a wavelength of a signal that is coupled to the second conductive layer thus insuring operation as a transmission line. The distributive capacitor further comprises terminals for coupling signals to and from the second conductive layer, the terminals further comprising a first terminal 313 disposed near a first end 314 of the second conductive layer 309 and a second terminal 315 disposed near a second end 316 of the second conductive layer, the first end and the second end separated by the second length 311. Note that it is possible that the distributive capacitor has the first conductive layer and the second conductive layer shorted together at the second end 316 of the second conductive layer, wherein the distributive capacitor demonstrates characteristics of a short circuited transmission line.

The distributive capacitor further preferably comprises another layer of a second dielectric material 317 that is disposed on the second conductive layer where present and on the first conductive layer otherwise. This dielectric layer 317 is disposed on both sides of the printed circuit board substrate and is known in the field of printed circuit board fabrication. The relative dielectric constant is approximately 3.3 for typical materials such as non photo imageable epoxy material known as J-HDI-1 applied via screen printing or as a resin coated conductive foil, such as copper foil, non-photo imageable epoxy material available from manufacturers such as Allied Signal, Polyclad, and Mitsui. The distributive capacitor preferably further comprises a via or micro via 319, typically formed using a laser, that passes through the other layer of dielectric material and that is filled with a conductive material, such as copper or the like, and that is disposed to contact the second conductive layer 309 near a first end 314 thereof and that is suitable for coupling signals to and from the second conductive layer.

The distributive capacitor further comprises a patterned conductive layer 321 disposed on the other layer of dielectric material, where the patterned conductive material includes a conductive trace contacting the filled via 319 to provide a terminal 322 for coupling signals to and from the second conductive layer. Note that the patterned conductive layer 321 may originate as the foil portion of the resin coated foil discussed above used to provide the other layer of the second dielectric material 317.

The distributive capacitor may farther comprise a second via 323, as depicted, that passes through the other layer of dielectric material 317, that is filled with the conductive material, and that is disposed to contact the second conductive layer near the second end 316 thereof and wherein the patterned conductive material includes a second conductive trace contacting the second via to provide a second terminal 324 for the coupling signals to and from the second conductive layer. The distributive capacitor is fabricated with the second length 311 and the second width (see FIGS. 6–9) of the second conductive layer and the thickness 308 of the dielectric material are selected to provide a predetermined impedance input or output for a signal with a frequency greater than 800 MHz and as we will discuss with reference to FIGS. 4 and 5 with a center frequency of 1.8 GHz.

The differential mode matching circuit may also be depicted according to FIG. 3, with the stipulations that the first conducting layer 305 is patterned approximately like the second conducting layer 309. Features needed for connecting the first conducting layer 305 to the patterned outer layer 321 are not shown in FIG. 3, but could be provided in a manner similar to the features shown for connecting the second conduction layer 309 to the patterned outer layer 321.

Given this construction the distributive capacitor may be arranged where the second conductive layer is disposed in a configuration having one of a rectangular and curved shape or where the second width is one of a uniform width, a stepped width, and a tapered width. The preferred dielectric material is a ceramic filled photo dielectric material such as Probelec 7081 from Ciba, a $BaTiO_3$ ceramic compound filled dielectric, that has demonstrated relative dielectric constants of 20 to 40 depending on percentage of the ceramic compound used. These filled photo dielectric materials may be applied to a substrate using curtain coating or a screening process. Another material that has been user is a PLZT ceramic compound $(Pb_{0.85}La_{0.15}(Zr_{0.52}Ti_{0.48})_{0.96}O_3)$ that is chemically deposited on a nickel coated conductive or copper foil and then laminated to a FR4 printed circuit board substrate. This has demonstrated relative dielectric constants of over 100 where the dielectric constant may be experimentally adjusted based on the percentage of the PLZT ceramic compound. The second dielectric material may further comprises either a non photo imageable epoxy or resin coated copper foil non photo imageable epoxy material as noted above.

Figure 5:
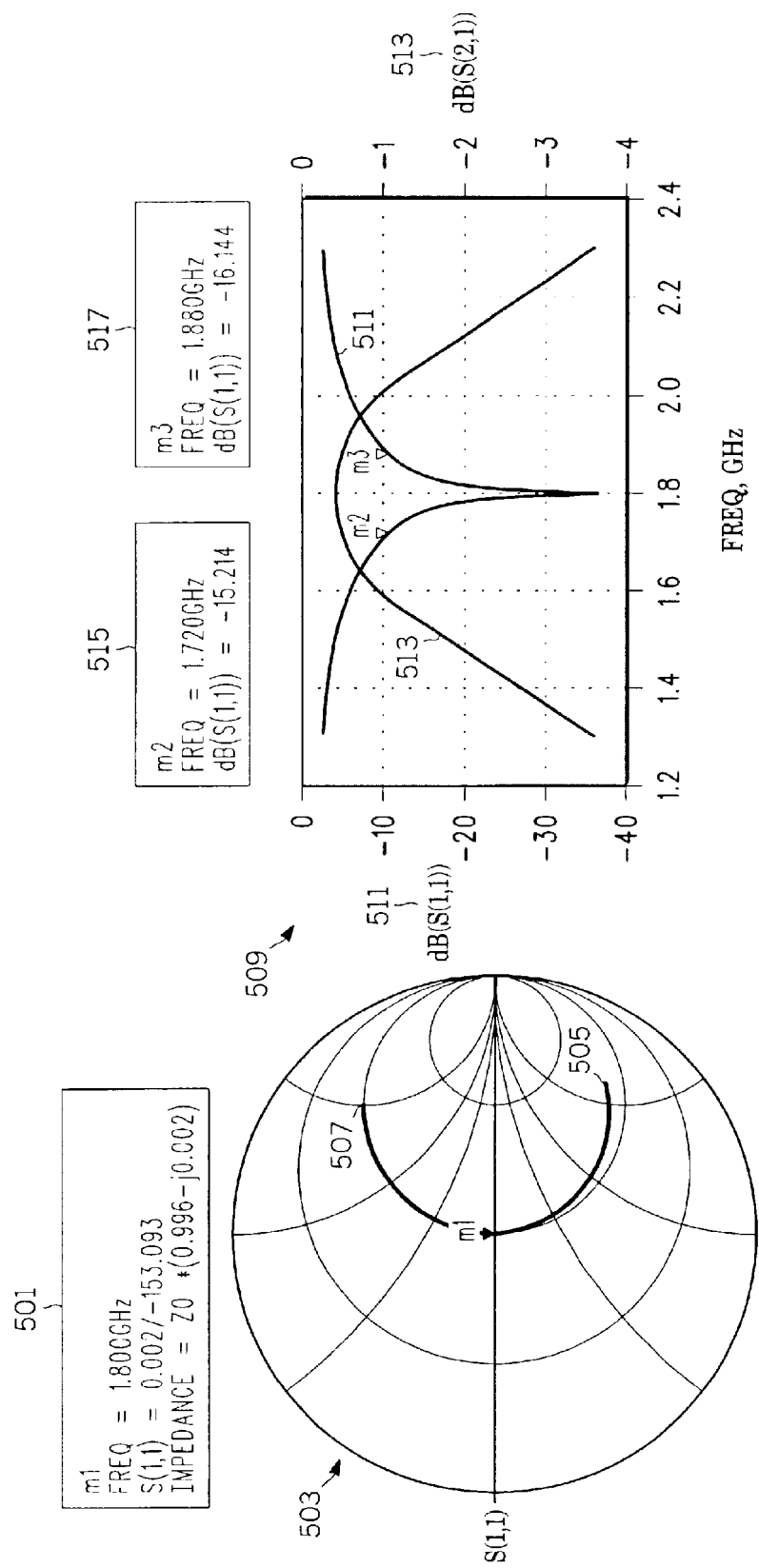

Referring to FIG. 4 and FIG. 5 an illustration of simulation results for various embodiments of the distributive capacitor of FIG. 3 will be discussed and described. FIG. 4 depicts simulation results for a distributive capacitor that uses a dielectric material with a relative dielectric constant of 50 and a thickness of 2/1000 of an inch. These simulations were developed using Advanced Design Systems tools available from Agilent Technologies. An arbitrary source impedance of 1.5−j1.5 was assumed as typical of a subscriber transmitter device or stage and this was matched to an antenna impedance of 50 ohms.

Experimentally it was determined that a width of 9.2 mils and a length of 240 mils was appropriate. Note that this compares favorably to a width of 40.6 mils and a length of 753 mils for a relative dielectric constant of 4 (approx the constant for FR 4 printed circuit board substrates). As can be seen, m1 401 defines a point at 1.8 GHZ on the smith chart 403 (normalized to the desired impedance of 1.5+j1.5) or very nearly the complex conjugate of the source impedance 1.5−j1.5. This chart varies from 1.3 GHz 405 to 2.3 GHz 407. The frequency response graph 409 shows return loss 411 and frequency response 413 in dB centered at 1.8 GHz. The return loss or measure of reflected power indicates approximately 15 dB return loss at points, m2 415 and m3 417.

FIG. 5 shows simulation results for the same impedance matching task as noted above for a dielectric material having a relative dielectric constant of 100. In this instance the best width was determined to be 5.5 mils and the length was 178 mils, a significant improvement over the FIG. 4 simulation and a dramatic improvement over the situation with a relative dielectric constant of 4 noted above. As can be seen, m1 501 defines a point at 1.8 GHZ on the smith chart 503 (normalized to the desired impedance of 1.5+j1.5) or very nearly the complex conjugate of the source impedance 1.5−j1.5. This chart varies from 1.3 GHz 505 to 2.3 GHz 507. The frequency response graph 509 shows return loss 511 and frequency response 513 in dB centered at 1.8 GHz. The return loss or measure of reflected power indicates approximately 15 dB return loss at points, m2 515 and m3 517.

Figure 6:
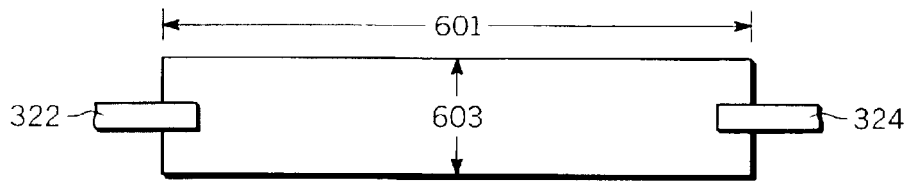
FIG. 6 through FIG. 9 show top plan views for various embodiments of the distributive capacitor of FIG. 3.
Figure 7:
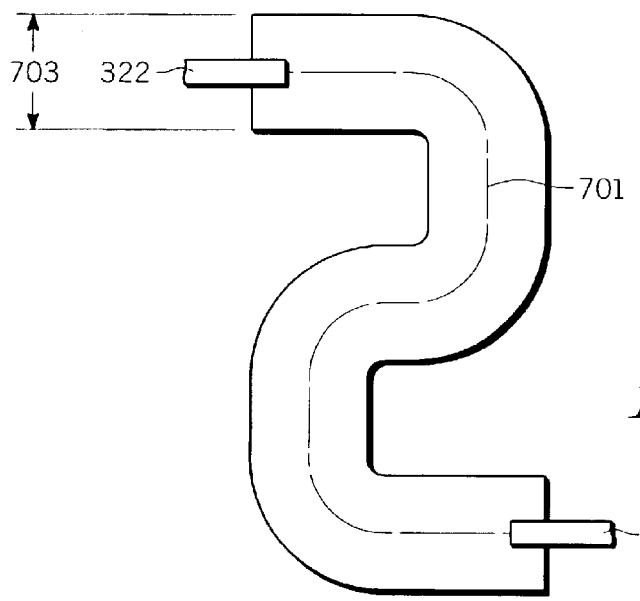
Figure 8:
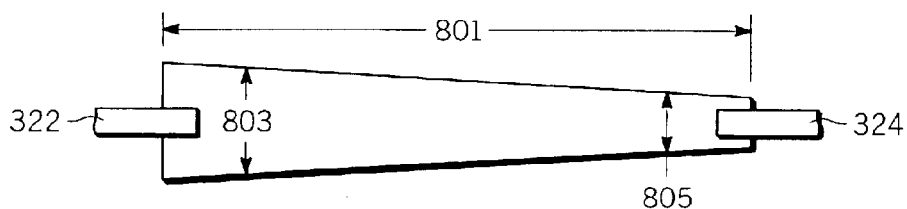
Figure 9:
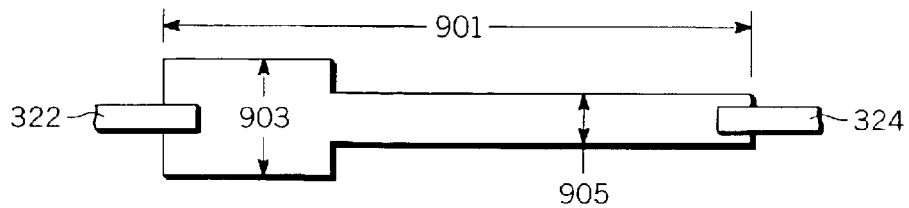

Referring to FIG. 6 through FIG. 9, top plan views for various embodiments of the second conductive layer 309 of the distributive capacitor 205 of FIG. 3 will be discussed and described. FIG. 6 indicates a rectangular shape with a length 601 and width 603 with a first terminal 322 and the second terminal 324. This is the general shape used in the simulation results of FIG. 4 and FIG. 5. FIG. 7 shows a curved shape or serpentine shape that may be used for further limiting physical area consumed. Here a length 701, generally the length along a center path for the second conductive layer is shown as well as a width 703 and the terminals 322 and 324 FIG. 8 shows another embodiment with a length 801 and a tapered width including a wide point with width 803 and a narrower point with width 805. The taper may be described as an exponential taper as is known. Again the terminals 322 and 324 are depicted. FIG. 9 shows yet another possible embodiment for the distributive capacitor and specifically the second conductive layer 309. In this figure the length is shown as 901 and the width is shown in a stepped configuration with a width 903 that is significantly larger than another width 905 where the terminal 322 is coupled to the portion having the width 903 and terminal 324 is coupled to the portion having width 905.

The distributive capacitor and applications thereof discussed and described above and the inventive principles and concepts thereof are intended to and will alleviate cost and size problems caused by prior art impedance matching approaches. Using these principles of disposing a high relative dielectric material, such as ceramic filled photo dielectric material, appropriately on a high density substrate advantageously provides a dramatic reduction in size of distributed networks together with their relative performance benefits at a very low cost. This may be employed in the various radio frequency circuits and systems throughout a user device, such as a cellular handset, personal digital assistant, or the like, and will enable a user thereof to enjoy the benefits such as lower cost and smaller size for user devices thus facilitating user satisfaction. It is expected that one of ordinary skill given the above described principles, concepts and examples will be able to implement other alternative distributive networks that will also offer or facilitate similar performance benefits. It is expected that the claims below cover most such alternatives.

This disclosure is intended to explain how to fashion and use various embodiments in accordance with the invention rather than to limit the true, intended, and fair scope and spirit thereof The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A distributive capacitor suitable for high density integration applications, the distributive capacitor comprising:
   a printed circuit substrate comprising one of a printed circuit board and a semiconductor based substrate;
   a first conductive layer disposed on the printed circuit substrate;
   a layer of dielectric material disposed on the first conductive layer and having a thickness, the dielectric material having a dielectric constant more than five times greater than the dielectric constant of the printed circuit substrate; and
   a second conductive layer disposed on the layer of dielectric material and having a second length and a second width that are selected so that the distributive capacitor operates as a transmission line.

2. The distributive capacitor of claim 1 wherein the second length is selected to exceed ten percent of a wavelength of a signal that is coupled to the second conductive layer.

3. The distributive capacitor of claim 1 further comprising terminals for coupling signals to and from the second conductive layer, the terminals further comprising a first terminal disposed near a first end of the second conductive layer and a second terminal disposed near a second end of the second conductive layer, the first end and the second end separated by the second length.

4. The distributive capacitor of claim 1 further comprising an other layer of a second dielectric material disposed on the second conductive layer.

5. The distributive capacitor of claim 4 further comprising a via through the other layer of dielectric material that is filled with a conductive material and that is disposed to contact the second conductive layer near a first end thereof and that is suitable for coupling signals to and from the second conductive layer.

6. The distributive capacitor of claim 4 further comprising a patterned conductive layer disposed on the other layer of dielectric material, the patterned conductive material including a conductive trace contacting the via to provide a terminal for the coupling signals to and from the second conductive layer.

7. The distributive capacitor of claim 6 wherein the first conductive layer and the second conductive layer are shorted together at a second end of the second conductive layer, wherein the distributive capacitor demonstrates characteristics of a short circuited transmission line.

8. The distributive capacitor of claim 6 further comprising a second via through the other layer of dielectric material that is filled with the conductive material and that is disposed to contact the second conductive layer near a second end thereof and wherein the patterned conductive material includes a second conductive trace contacting the second via to provide a second terminal for the coupling signals to and from the second conductive layer.

9. The distributive capacitor of claim 1 wherein the second length and the second width of the second conductive layer and the thickness of the dielectric material are selected to provide a predetermined impedance for a signal with a frequency greater than 800 MHz.

10. The distributive capacitor of claim 1 wherein the second conductive layer is disposed in a configuration having one of a rectangular and curved shape.

11. The distributive capacitor of claim 9 wherein the second width is one of a uniform width, a stepped width, and a tapered width.

12. The distributive capacitor of claim 1 wherein the dielectric material is a ceramic filled photo dielectric material further comprising one of Probelec 7081 and a ceramic compound deposited on a conductive foil and then laminated to a printed circuit substrate.

13. The distributive capacitor of claim 1 wherein the second dielectric material further comprises one of a non photo imageable epoxy material and a resin coated conductive foil non photo imageable epoxy material.

14. An impedance matching circuit suitable for high density integration applications, the matching circuit comprising;

an input terminal that provides an input impedance that is a complex conjugate of a predetermined source impedance for a signal having a predetermined frequency;

a distributive capacitor disposed on a printed circuit substrate comprising one of a printed circuit board and a semiconductor based substrate, the distributive capacitor further comprising;

a first conductive layer disposed on the printed circuit substrate;

a layer of dielectric material disposed on the first conductive layer and having a thickness, the dielectric material having a dielectric constant more than five times greater than the dielectric constant of the printed circuit substrate; and a second conductive layer disposed on the layer of dielectric material and having a second length selected to exceed ten percent of a wavelength for the signal having the predetermined frequency and a second width that are selected so that the distributive capacitor operates as a transmission line, the second conductive layer including a first end that is coupled to the input terminal and a second end separated by the second length from the first end; and an output terminal, coupled to the second end, that provides an output impedance that is a complex conjugate of a predetermined load impedance for the signal having the predetermined frequency.

15. The impedance matching circuit of claim 14 wherein the distributive capacitor further comprises another layer of a second dielectric material disposed on the second conductive layer.

16. The impedance matching circuit of claim 15 further comprising a first via and a second via through the other layer of dielectric material and a patterned conductive layer disposed on the other layer of dielectric material, the patterned conductive material filling the first via and the second via and including a first conductive trace contacting the first via to provide the input terminal for coupling signals to the distributive capacitor a second conductive trace contacting the second via to provide the output terminal for coupling the signals from the second conductive layer.

17. The impedance matching circuit of claim 14 wherein the second length and the second width of the second conductive layer and the thickness of the dielectric material are selected to provide a predetermined impedance transformation for the signal where the predetermined frequency is greater than 800 MHz.

18. The impedance matching circuit of claim 14 wherein the dielectric material is a ceramic filled photo dielectric material further comprising one of Probelec 7081 and a ceramic compound deposited on a conductive foil and then laminated to a printed circuit substrate.

19. The impedance matching circuit of claim 14 wherein the second dielectric material further comprises one of a non photo imageable epoxy material and a resin coated conductive foil non photo imageable epoxy material.

20. A radio frequency power amplifier for amplifying a signal and driving an antenna network with a predetermined impedance, the power amplifier comprising;

a power amplifier stage having a complex output impedance that provides an amplified signal;

an impedance matching circuit disposed on a printed circuit substrate comprising one of a printed circuit board and a semiconductor based substrate, the impedance matching circuit, coupled to the amplified signal and providing an input impedance that is a complex conjugate of the complex output impedance, the impedance matching circuit further comprising:

a first conductive layer disposed on the printed circuit substrate;

a layer of dielectric material disposed on the first conductive layer and having a thickness, the dielectric material having a dielectric constant more than five times greater than the dielectric constant of the printed circuit substrate; and a second conductive layer disposed on the layer of dielectric material and having a second length selected to exceed ten percent of a wavelength for the amplified signal and a second width that are selected so that the impedance matching circuit operates as a transmission line, the second conductive layer including a first end that is coupled to the amplified signal and a second end separated by the second length from the first end, wherein the second end is coupled to the antenna network and provides an output impedance that is a complex conjugate of a predetermined impedance of the antenna network.

21. The radio frequency power amplifier of claim 20 wherein the impedance matching circuit further comprises an other layer of a second dielectric material disposed on the second conductive layer.

22. The radio frequency power amplifier of claim 21 wherein the impedance matching circuit further comprising a first via and a second via through the other layer of dielectric material and a patterned conductive layer disposed on the other layer of dielectric material, the patterned conductive material filling the first via and the second via and including a first conductive trace contacting the first via to provide an input terminal coupled to the amplified signal and a second conductive trace contacting the second via to provide an output terminal coupled to the antenna network.

23. The radio frequency power amplifier of claim 21 wherein the second length and the second width of the second conductive layer and the thickness of the dielectric material are selected to provide a predetermined impedance transformation for the amplified signal with a frequency that is greater than 800 MHz.

24. The radio frequency power amplifier of claim 20 wherein the dielectric material is a ceramic filled photo dielectric material further comprising one of Probelec 7081 and a ceramic compound deposited on a conductive foil and then laminated to a printed circuit substrate.

25. The radio frequency power amplifier of claim 20 wherein the second dielectric material further comprises one of a non photo imageable epoxy material and a resin coated conductive foil non photo imageable epoxy material.

* * * * *